(12) United States Patent
Li et al.

(10) Patent No.: US 11,005,439 B2
(45) Date of Patent: May 11, 2021

(54) EARPHONE VOLUME ADJUSTMENT METHOD AND APPARATUS

(71) Applicant: HUAWEI TECHNOLOGIES CO., LTD., Shenzhen (CN)

(72) Inventors: Yan Li, Shenzhen (CN); Jianchun Fan, Shenzhen (CN); Yu Zhu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 291 days.

(21) Appl. No.: 16/063,259

(22) PCT Filed: Dec. 7, 2016

(86) PCT No.: PCT/CN2016/108907
§ 371 (c)(1),
(2) Date: Jun. 16, 2018

(87) PCT Pub. No.: WO2017/101719
PCT Pub. Date: Jun. 22, 2017

(65) Prior Publication Data
US 2020/0252039 A1    Aug. 6, 2020

(30) Foreign Application Priority Data

Dec. 16, 2015  (CN) .......................... 201510947115.6

(51) Int. Cl.
*H03G 3/32*     (2006.01)
*H04R 1/10*     (2006.01)
*H04R 5/04*     (2006.01)

(52) U.S. Cl.
CPC ............. *H03G 3/32* (2013.01); *H04R 1/1041* (2013.01); *H04R 5/04* (2013.01); *H04R 2430/01* (2013.01)

(58) Field of Classification Search
CPC ... H03G 3/32; H03G 3/20; H03G 3/24; H04R 1/1041; H04R 5/04; H04R 2430/01;
(Continued)

(56) References Cited

U.S. PATENT DOCUMENTS

| 2006/0204025 | A1  | 9/2006 | Paludan-Muller et al. |
| 2007/0189544 | A1* | 8/2007 | Rosenberg ........... G11B 27/105 |
| | | | 381/57 |

(Continued)

FOREIGN PATENT DOCUMENTS

| CN | 1879449 A   | 12/2006 |
| CN | 101909224 A | 12/2010 |

(Continued)

*Primary Examiner* — Andrew C Flanders
(74) *Attorney, Agent, or Firm* — Kilpatrick Townsend & Stockton LLP

(57) ABSTRACT

Embodiments of the present invention provide an earphone volume adjustment method and apparatus. The method includes: when it is detected that an intensity of external environmental noise is greater than a preset threshold, obtaining position information and/or a motion status of a user; determining a time window according to the position information and/or the motion status; and adjusting earphone volume according to an intensity of external environmental noise in the time window. According to the embodiments of the present invention, an inappropriate phenomenon such as turning up or turning down the earphone volume in a short time can be avoided, and the earphone volume can be appropriately adjusted by comprehensively considering the intensity of the external environmental noise and the position information and/or the motion status of the user. Therefore, user experience is improved.

12 Claims, 2 Drawing Sheets

---

When it is detected that an intensity of external environmental noise is greater than a preset threshold, obtain position information and/or a motion status of a user  — S101

Determine a time window according to the position information and/or the motion status  — S102

Adjust earphone volume according to an intensity of external environmental noise in the time window  — S103

(58) Field of Classification Search
CPC ...... H04S 2400/13; H04S 1/005; H04S 3/004; H04S 7/302; H04S 7/303; H04S 7/304; H04S 7/305; H04S 7/306; G06F 3/16; G06F 3/162; G06F 3/165
See application file for complete search history.

(56) References Cited

U.S. PATENT DOCUMENTS

| | | | |
|---|---|---|---|
| 2008/0043996 A1* | 2/2008 | Dolph | H04N 5/60 379/388.07 |
| 2008/0153537 A1* | 6/2008 | Khawand | H03G 3/32 455/550.1 |
| 2009/0022329 A1* | 1/2009 | Mahowald | H03G 3/32 381/57 |
| 2009/0310793 A1* | 12/2009 | Ohkuri | H03G 3/32 381/58 |
| 2010/0005953 A1 | 1/2010 | Kemmochi et al. | |
| 2010/0146445 A1* | 6/2010 | Kraut | H03G 3/02 715/821 |
| 2010/0303259 A1 | 12/2010 | Jia | |
| 2011/0095875 A1* | 4/2011 | Thyssen | G09G 5/10 340/407.1 |
| 2011/0305346 A1* | 12/2011 | Daubigny | H03G 3/32 381/28 |
| 2013/0287215 A1* | 10/2013 | Kim | H03G 3/02 381/57 |
| 2014/0044269 A1* | 2/2014 | Anderson | H04R 5/04 381/57 |
| 2015/0078575 A1 | 3/2015 | Selig et al. | |
| 2015/0104041 A1* | 4/2015 | Kulavik | H04R 1/1041 381/107 |
| 2015/0171813 A1* | 6/2015 | Ganatra | H03G 3/24 381/57 |
| 2015/0222977 A1* | 8/2015 | Angel, Jr. | H04R 1/105 381/74 |
| 2015/0281853 A1* | 10/2015 | Eisner | H04R 25/505 381/312 |
| 2015/0326196 A1* | 11/2015 | Park | H03G 3/20 381/107 |
| 2016/0056781 A1* | 2/2016 | Rose | H03G 3/32 381/107 |
| 2016/0173049 A1* | 6/2016 | Mehta | H03G 3/32 381/57 |
| 2017/0053666 A1* | 2/2017 | Konjeti | H03G 3/342 |
| 2017/0140773 A1* | 5/2017 | Bostick | H04M 15/8033 |
| 2018/0352354 A1* | 12/2018 | Chandrashekar | H04R 29/001 |

FOREIGN PATENT DOCUMENTS

| | | |
|---|---|---|
| CN | 102595272 A | 7/2012 |
| CN | 103716458 A | 4/2014 |
| CN | 104394491 A | 3/2015 |
| CN | 204377107 U | 6/2015 |
| CN | 204465846 U | 7/2015 |
| CN | 105025417 A | 11/2015 |
| JP | H04278796 A | 10/1992 |
| JP | 2010136034 A | 6/2010 |
| JP | 2010192012 A | 9/2010 |
| JP | 2012109769 A | 6/2012 |
| JP | 2014195175 A | 10/2014 |

\* cited by examiner

EARPHONE VOLUME ADJUSTMENT METHOD AND APPARATUS

CROSS-REFERENCE TO RELATED APPLICATIONS

This application is a national stage of International Application No. PCT/CN2016/108907, filed on Dec. 7, 2016, which claims priority to Chinese Patent Application No. 201510947115.6, filed on Dec. 6, 2015. Both of the aforementioned applications are hereby incorporated by reference in their entireties.

TECHNICAL FIELD

Embodiments of the present invention relate to communications technologies, and in particular, to an earphone volume adjustment method and apparatus.

BACKGROUND

With development of mobile terminals, earphones become standard accessories of the mobile terminals. A user can perform activities such as calling, listening to music, and watching movies by using an earphone. However, the user has many inconveniences when using the earphone. For example, the user needs to manually adjust volume as an environment changes, or the user needs to manually adjust volume when voice source quality is different.

Currently, a mobile terminal may automatically adjust earphone volume according to a user scenario. Specifically, the mobile terminal detects external environmental noise, and analyzes the external environmental noise to determine the user scenario. Then, according to the user scenario, the mobile terminal obtains an earphone volume value corresponding to the scenario, and controls a receiver of the mobile terminal to output corresponding volume. The mobile terminal pre-stores scenario information and an earphone volume value corresponding to the scenario information.

According to the foregoing technology, the user scenario is determined according to the external environmental noise. Because an error may exist in scenario determining, the earphone volume cannot be appropriately adjusted. For example, when a user is running, an ambulance passes. Earphone volume is turned up due to a relatively loud sound of the ambulance. After the ambulance runs away quickly, the earphone volume is turned down rapidly. Overadjustment in such a short time is not only inappropriate, but also brings relatively poor actual experience to the user.

SUMMARY

Embodiments of the present invention provide an earphone volume adjustment method and apparatus, so as to appropriately adjust earphone volume and improve user experience.

According to a first aspect, an embodiment of the present invention provides an earphone volume adjustment method, including: when it is detected that an intensity of external environmental noise is greater than a preset threshold, obtaining position information and/or a motion status of a user; determining a time window according to the position information and/or the motion status; and adjusting earphone volume according to an intensity of external environmental noise in the time window.

In this embodiment of the present invention, when it is detected that the intensity of the external environmental noise is greater than the preset threshold, the position information and the motion status of the user is obtained; the time window is determined according to the position information and the motion status of the user; and the earphone volume is adjusted according to the intensity of the external environmental noise in the time window. Compared with the prior art, in this embodiment of the present invention, an inappropriate phenomenon such as turning up or turning down the earphone volume in a short time is avoided, and the earphone volume is appropriately adjusted by comprehensively considering the intensity of the external environmental noise and the position information and the motion status of the user. Therefore, user experience is improved.

In a first possible implementation of the first aspect, the determining a time window according to the position information and/or the motion status includes: determining the time window according to the position information, which is specifically: determining, based on the position information, a type of an environment in which the user is located, where the environment type includes a quiet environment, a noisy environment, and an unidentifiable environment; and determining the time window according to a preset correspondence between an environment type and a time window; or determining the time window according to the motion status, which is specifically: determining stay duration of the user in a position according to the motion status, where the time window is the stay duration; or determining the time window according to the position information and the motion status, which is specifically: determining, based on the position information, a type of an environment in which the user is located; and determining the time window according to the environment type and the motion status.

In this embodiment of the present invention, according to diverse implementations, the user may use various manners to determine the time window. Therefore, user experience is improved.

In a second possible implementation of the first aspect, the adjusting earphone volume according to an intensity of external environmental noise in the time window includes: if an intensity of external environmental noise at a cut-off point of the time window is greater than the preset threshold, determining, according to a preset correspondence between an noise intensity and an earphone volume adjustment value, an earphone volume adjustment value corresponding to the intensity of the external environmental noise at the cut-off point of the time window; and adjusting the earphone volume by using the earphone volume adjustment value corresponding to the intensity of the external environmental noise at the cut-off point of the time window, where the earphone volume adjustment value includes one of a weighting coefficient, an increased value, or a decreased value.

In a third possible implementation of the first aspect, the adjusting earphone volume according to an intensity of external environmental noise in the time window includes: if an average intensity of the external environmental noise in the time window is greater than the preset threshold, determining, according to a preset correspondence between a noise intensity and an earphone volume adjustment value, an earphone volume adjustment value corresponding to the average intensity; and adjusting the earphone volume by using the earphone volume adjustment value corresponding to the average intensity, where the earphone volume adjustment value includes one of a weighting coefficient, an increased value, or a decreased value.

In the foregoing implementation, according to the foregoing specific implementations and by pre-establishing a correspondence between a noise intensity and earphone volume, the following problem can be avoided: Blindly turning up the earphone volume causes damage to hearing of the user when the intensity of the external environmental noise is relatively high. Therefore, the earphone volume is appropriately adjusted.

In a fourth possible implementation of the first aspect, the method further includes: after a preset earphone volume adjustment time, when it is detected that the intensity of the external environmental noise is less than the preset threshold, restoring the earphone volume to an unadjusted value.

In this embodiment of the present invention, after the preset earphone volume adjustment time, when the intensity of the external environmental noise is less than the preset threshold, the earphone volume can be restored to the unadjusted value. Therefore, user experience is further improved.

In a fifth possible implementation of the first aspect, the method further includes: detecting physiological status information of the user, where the physiological status information includes one or any combination of an ECG signal characteristic, a PPG signal characteristic, blood pressure, blood oxygen, an electromyographic signal, a facial expression, a heart rate, a body temperature, or pressure; determining an earphone volume adjustment value corresponding to the physiological status information, where the earphone volume adjustment value includes one of a weighting coefficient, an increased value, or a decreased value; and adjusting the earphone volume by using the earphone volume adjustment value corresponding to the physiological status information.

In the foregoing implementation, current physiological status information of the user is detected. Because different physiological status information has different earphone volume requirements and tolerance, when it is determined whether adjustment of the earphone volume is required, the current physiological status information of the user is also considered, and an earphone volume is adjusted according to the physiological status information of the user. Therefore, user experience is better. For example, when the user has relatively large pressure or is stressed, the earphone volume may be appropriately turned down; or when the user has no pressure or small pressure, the earphone volume may be appropriately turned up.

In a sixth possible implementation of the first aspect, the method further includes: detecting a service type of an audio signal in an earphone; and if the service type of the audio signal is an emergency service, decreasing a size of the time window to a preset time window value corresponding to the emergency service, where the emergency service includes a call service and a preset reminder.

In the foregoing implementation, the size of the time window is adjusted for the emergency service, and the earphone volume is appropriately adjusted in a scenario of the emergency service. Therefore, user perception is improved.

According to a second aspect, an embodiment of the present invention provides an earphone volume adjustment apparatus, including: a detection module, configured to detect whether an intensity of external environmental noise is greater than a preset threshold; an obtaining module, configured to: when the detection module detects that the intensity of the external environmental noise is greater than the preset threshold, obtain position information and/or a motion status of a user; a determining module, configured to determine a time window according to the position information and/or the motion status; and an adjustment module, configured to adjust earphone volume according to an intensity of external environmental noise in the time window.

In this embodiment of the present invention, when it is detected that the intensity of the external environmental noise is greater than the preset threshold, the position information and the motion status of the user is obtained; the time window is determined according to the position information and the motion status of the user; and the earphone volume is adjusted according to the intensity of the external environmental noise in the time window. Compared with the prior art, in this embodiment of the present invention, an inappropriate phenomenon such as turning up or turning down the earphone volume in a short time is avoided, and the earphone volume is appropriately adjusted by comprehensively considering the intensity of the external environmental noise and the position information and the motion status of the user. Therefore, user experience is improved.

In a first possible implementation of the second aspect, the determining module is specifically configured to: determine, based on the position information, a type of an environment in which the user is located, where the environment type includes a quiet environment, a noisy environment, and an unidentifiable environment; determine the time window according to a preset correspondence between an environment type and a time window; or determine stay duration of the user in a position according to the motion status, where the time window is the stay duration; or determine, based on the position information, a type of an environment in which the user is located; and determine the time window according to the environment type and the motion status. According to diverse implementations, the user may use various manners to determine the time window. Therefore, user experience is improved.

In a second possible implementation of the second aspect, the adjustment module is specifically configured to: if an intensity of external environmental noise at a cut-off point of the time window is greater than the preset threshold, determine, according to a preset correspondence between a noise intensity and an earphone volume adjustment value, an earphone volume adjustment value corresponding to the intensity of the external environmental noise at the cut-off point of the time window; and adjust the earphone volume by using the earphone volume adjustment value corresponding to the intensity of the external environmental noise at the cut-off point of the time window, where the earphone volume adjustment value includes one of a weighting coefficient, an increased value, or a decreased value.

In a third possible implementation of the second aspect, the adjustment module is specifically configured to: if an average intensity of the external environmental noise in the time window is greater than the preset threshold, determine, according to a preset correspondence between a noise intensity and an earphone volume adjustment value, an earphone volume adjustment value corresponding to the average intensity; and adjust the earphone volume by using the earphone volume adjustment value corresponding to the average intensity, where the earphone volume adjustment value includes one of a weighting coefficient, an increased value, or a decreased value.

In the foregoing implementation, according to the foregoing specific implementations and by pre-establishing a correspondence between a noise intensity and earphone volume, the following problem can be avoided: Blindly turning up the earphone volume causes damage to hearing of the user when the intensity of the external environmental noise is relatively high. Therefore, the earphone volume is appropriately adjusted.

In a fourth possible implementation of the second aspect, the adjustment module is further configured to: after a preset earphone volume adjustment time, when the detection module detects that the intensity of the external environmental noise is less than the preset threshold, restore the earphone volume to an adjusted value.

In this embodiment of the present invention, after the preset earphone volume adjustment time, when the intensity of the external environmental noise is less than the preset threshold, the earphone volume can be restored to the unadjusted value. Therefore, user experience is further improved.

In a fifth possible implementation of the second aspect, the detection module is further configured to detect physiological status information of the user, where the physiological status information includes one or any combination of an ECG signal characteristic, a PPG signal characteristic, blood pressure, blood oxygen, an electromyographic signal, a facial expression, a heart rate, a body temperature, or pressure; the determining module is further configured to determine an earphone volume adjustment value corresponding to the physiological status information, where the earphone volume adjustment value includes one of a weighting coefficient, an increased value, or a decreased value; and the adjustment module is further configured to adjust the earphone volume by using the earphone volume adjustment value corresponding to the physiological status information.

In the foregoing implementation, current physiological status information of the user is detected. Because different physiological status information has different earphone volume requirements and tolerance, when it is determined whether adjustment of the earphone volume is required, the current physiological status information of the user is also considered, and an earphone volume is adjusted according to the physiological status information of the user. Therefore, user experience is better. For example, when the user has relatively large pressure or is stressed, the earphone volume may be appropriately turned down; or when the user has no pressure or small pressure, the earphone volume may be appropriately turned up.

In a sixth possible implementation of the second aspect, the detection module is further configured to detect a service type of an audio signal in an earphone; and the determining module is further configured to: if the service type of the audio signal is an emergency service, decrease a size of the time window to a preset time window value corresponding to the emergency service, where the emergency service includes a call service and a preset reminder.

In the foregoing implementation, the size of the time window is adjusted for the emergency service, and the earphone volume is appropriately adjusted in a scenario of the emergency service. Therefore, user perception is improved.

According to a third aspect, an embodiment of the present invention provides a terminal, where the terminal includes a processor, a memory, a microphone, and a motion sensor, the microphone is configured to: collect a noise signal in an external environment, and convert the noise signal into an electrical signal; the motion sensor is configured to sense a motion status of a user; and the memory stores a program or an instruction, and the processor is configured to execute the method according to any implementation of the first aspect by invoking the program or the instruction stored in the memory.

These and other aspects of the embodiments of the present invention are more concise and comprehensible in description of the following (multiple) embodiments.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly and completely describes the technical solutions in the embodiments of the present invention with reference to the accompanying drawings in the embodiments of the present invention. Apparently, the described embodiments are some but not all of the embodiments of the present invention. All other embodiments obtained by persons of ordinary skill in the art based on the embodiments of the present invention without creative efforts shall fall within the protection scope of the present invention.

Earphones are mostly applied to a notebook computer, a desktop computer, a tablet computer, a telephone, and a portable electronic device such as a mobile phone or a personal digital assistant (Personal Digital Assistant, PDA for short). By using an earphone, a user may receive an audio signal without affecting other persons. In addition, by using an earphone, a sound from an ambient environment may be separated. This is very helpful for a user in a noisy environment such as in a recording studio, on a journey, or during doing sports. A scenario in which an earphone is used includes: on the way to and from work, in travel, doing sports, and driving a car.

Considering that a problem of inappropriate overadjustment in a short time and poor user experience exists in an existing earphone volume adjustment method, the embodiments of the present invention provide an earphone volume adjustment method. According to the method, to-be-adjusted earphone volume is intelligently determined and analyzed by comprehensively considering an external environment, a user status, and a time in which a user is located in the external environment, and the earphone volume is intelligently adjusted based on situation awareness, to avoid an inappropriate phenomenon of overadjusting the earphone volume in a short time, and appropriately adjust the earphone volume. Therefore, user experience is improved. For example, the inappropriate phenomenon is the following phenomenon: When a user is running, an ambulance passes and earphone volume is turned up due to a relatively loud sound of the ambulance, and after the ambulance has passed quickly, the earphone volume is turned down rapidly.

Embodiment

Figure 1:
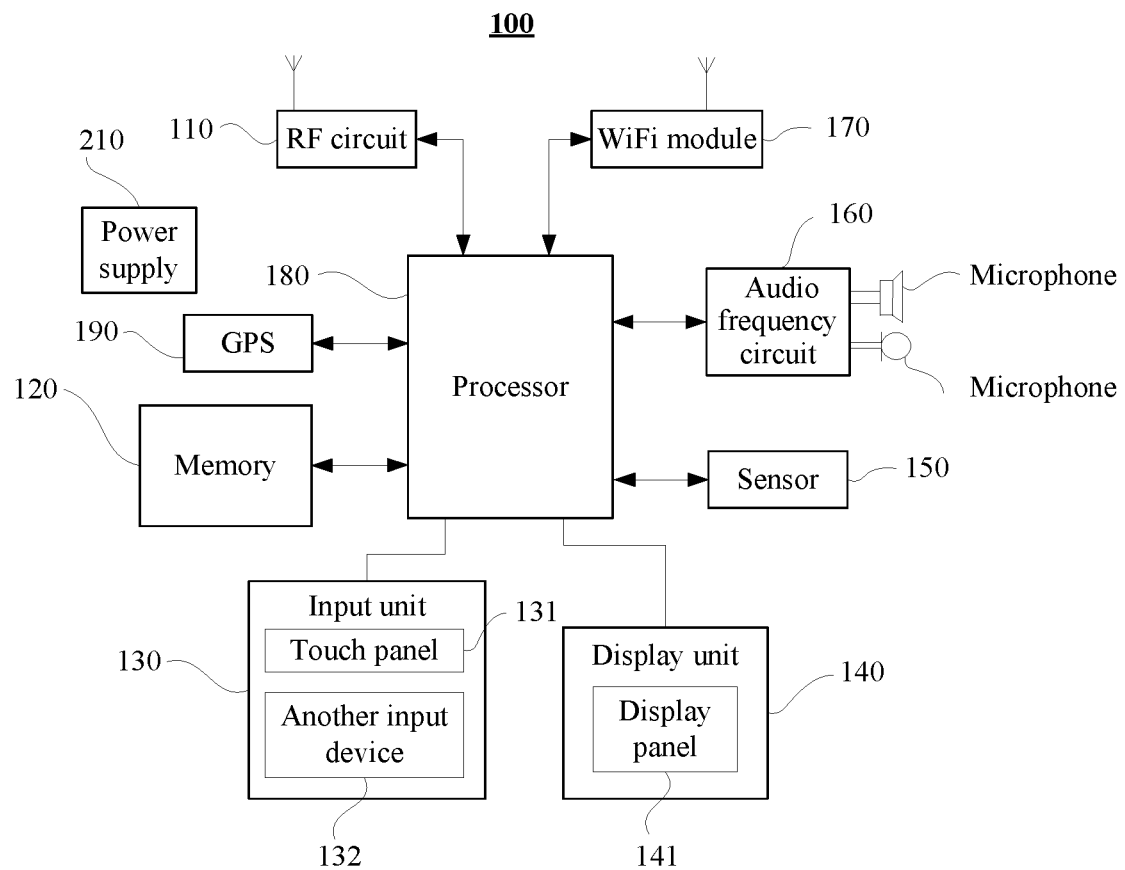
FIG. 1 is a schematic structural diagram of Embodiment 1 of a terminal according to the present invention.

FIG. 1 is a schematic structural diagram of Embodiment 1 of a terminal according to the present invention. As shown in FIG. 1, the terminal 100 in this embodiment includes components such as a radio frequency (Radio Frequency, RF for short) circuit 110, a memory 120, an input unit 130, a display unit 140, a sensor 150, an audio frequency circuit 160, a Wireless Fidelity (wireless fidelity, WiFi for short) module 170, a processor 180, a Global Positioning System (Global Positioning System, GPS for short) 190, and a power supply 210. Persons skilled in the art can understand that a structure of the terminal shown in FIG. 1 does not constitute a limitation on the terminal, and the terminal may include more or fewer components than those shown in the figure, or a combination of some components, or the components disposed differently.

The following describes some constituent components of the terminal 100 in detail with reference to FIG. 1.

It can be understood that the memory 120 may be a memory of the terminal 100 or a memory and an external memory of the terminal 100. The memory 120 includes a non-volatile random access memory (Non-Volatile Random Access Memory, NVRAM for short), a dynamic random access memory (Dynamic Random Access Memory, DRAM for short), a static random access memory (Static Random Access Memory, SRAM for short), a flash flash, a hard disk, an optical disc, a universal serial bus (Universal Serial Bus, USB for short) disk, a floppy disk, or a tape drive.

The input unit 130 may be configured to: receive input digital or character information, such as a Chinese character string or an alphabetic string entered by a user; and generate signal input related to user setting and function control of the terminal 100. Specifically, in this embodiment of the present invention, the input unit 130 may include a touch panel 131. The touch panel 131, also referred to as a touchscreen, may collect a touch operation performed by a user on or near the touch panel 131 (for example, an operation performed on or near the touch panel 131 by the user by using a finger, a stylus, or any other suitable object or accessory), and drive a corresponding connection apparatus according to a preset program. Optionally, the touch panel 131 may include two parts: a touch detection apparatus and a touch controller. The touch detection apparatus detects a touch azimuth of the user, detects a signal brought by a touch operation, and transmits the signal to the touch controller. The touch controller receives touch information from the touch detection apparatus, converts the touch information into contact coordinates, and then sends the contact coordinates to the processor 180; and can receive and execute a command sent by the processor 180. In addition, the touch panel 131 may be implemented by using multiple types, such as a resistive type, a capacitive type, an infrared type, and a surface acoustic wave type.

In addition to the touch panel 131, the input unit 130 may include another input device 132. The another input device 132 may include but is not limited to one or more of a physical keyboard, a function key (for example, a volume control key or an on/off key), a trackball, a mouse, a joystick, or the like.

The sensor 150 includes a pressure sensor, a motion sensor, and the like. The motion sensor is configured to sense a motion status of the user.

The display unit 140 may be configured to display information entered by the user or information provided for the user, and various menu interfaces of the terminal 100. Specifically, the display unit 140 may include a display panel 141. Optionally, the display panel 141 may be configured in a form of a liquid crystal display (Liquid Crystal Display, LCD for short), an organic light-emitting diode (Organic Light-Emitting Diode, OLED for short), or the like.

The touch panel 131 covers the display panel 141 to form a touch display screen. After detecting a touch operation on or near the touch display screen, the touch display screen transmits information about the touch operation to the processor 180 to determine a touch event type, and then the processor 180 provides corresponding visual output on the touch display screen according to the touch event type. The touch display screen includes an application interface display area and a common widget display area. An arrangement manner of the application interface display area and the common widget display area is not limited, and may be an arrangement manner such as up-and-down arrangement or left-and-right arrangement that can distinguish the two display areas. The application interface display area may be used to display an application interface. Each interface may include at least one interface element such as an application icon and/or a home screen widget. The application interface display area may also be an empty interface that does not include any content. The common widget display area is used to display a widget used relatively frequently, for example, an application icon such as a setting button icon, an interface number icon, a scroll bar icon, or a telephone book icon.

The audio frequency circuit 160 includes a loudspeaker and a microphone (Microphone, Mic for short). The microphone is also referred to as a microphone, and the microphone is configured to: collect a noise signal in an external environment, and convert the noise signal into an electrical signal. The loudspeaker is a transduction device that converts an electrical signal into a sound signal.

The processor 180 is a control center of the terminal 100, is connected to various parts of the entire terminal by using various interfaces and lines, and executes various functions of the terminal 100 and processes data by running or executing a software program and/or module and data that are stored in the memory 120, so as to perform overall monitoring on the terminal 100. Optionally, the processor 180 may include one or more processing units.

In this embodiment of the present invention, the processor 180 is configured to execute the following method embodiment by invoking a program or an instruction stored in the memory 120.

Figure 2:
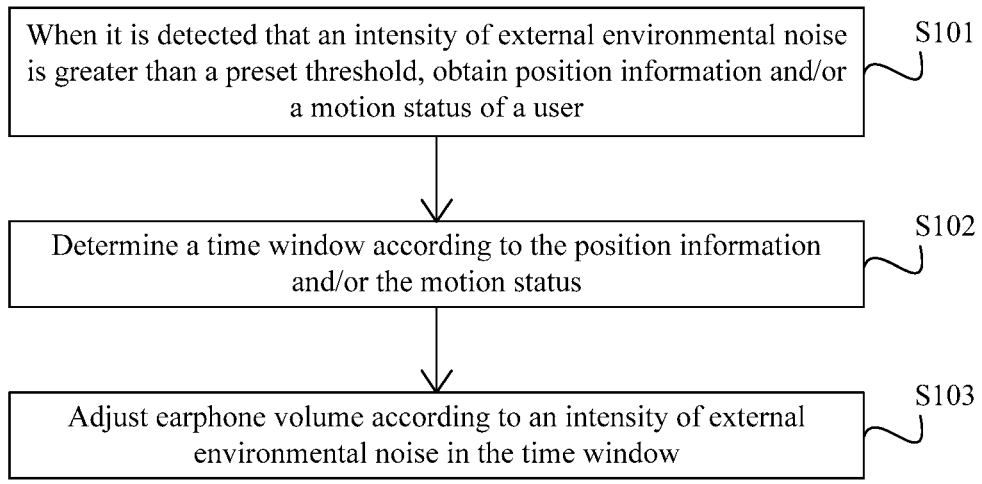
FIG. 2 is a flowchart of Embodiment 1 of an earphone volume adjustment method according to the present invention.

FIG. 2 is a flowchart of Embodiment 1 of an earphone volume adjustment method according to the present invention. An embodiment of the present invention provides an earphone volume adjustment method. The method may be executed by an earphone volume adjustment apparatus, and the apparatus may be integrated into a terminal (for example, a smartphone).

Referring to FIG. 2, the earphone volume adjustment method includes the following steps.

S101. When it is detected that an intensity of external environmental noise is greater than a preset threshold, obtain position information and/or a motion status of a user.

Specifically, an example in which the method is executed by the terminal shown in FIG. 1 is used for description.

The terminal collects a noise signal in an external environment by using a Mic, and converts the noise signal into an electrical signal by using the microphone. A processor of the terminal may obtain an intensity of the external environmental noise according to the electrical signal. For example, the terminal determines the intensity of the external environmental noise by calculating a quadratic sum of an amplitude value of the electrical signal.

It should be noted that, in any embodiment of the present invention, the noise signal is all sound signals in the external environment, that is, all sound signals different from an audio signal that is received by the user by using an earphone.

The preset threshold is set according to an actual requirement. For example, an earphone volume usage habit of the user may be pre-collected, earphone volume suitable for public users may be determined based on the earphone volume usage habit as the preset threshold. Alternatively, in a using process, the user may pre-store a preset threshold suitable for the user as a rule for determining earphone volume adjustment. In addition, the preset threshold may be set in another manner. A specific implementation form of the preset threshold is not limited in this embodiment of the present invention.

The terminal detects the noise signal in the external environment in real time. When detecting that the intensity of the external environmental noise is greater than the preset threshold, the terminal may determine the position information of the user by means of GPS positioning, and may obtain the motion status of the user by using a motion sensor.

The determining the position information of the user by means of GPS positioning is specifically implemented as: obtaining coordinate information (longitude and latitude) of a position of the user, and determining, based on a correspondence between coordinates and a place name, place name information corresponding to the coordinate information. For example, position information such as Beijing Tian'anmen corresponding to user coordinates may be determined according to a stored mapping relationship between coordinate information and a place name in a map.

There are multiple methods for obtaining the coordinate information of the position of the user by means of GPS positioning. The following provides description by using examples.

1. A GPS positioning method may include the following according to different positions of a reference point:

(1) Perform absolute positioning. That is, in a conventional terrestrial coordinate system, a receiver is used for detecting a position, relative to a conventional terrestrial centroid, of the user. Absolute positioning is also referred to as single-point positioning. Herein, it may be considered that the reference point coincides with the conventional terrestrial centroid. The conventional terrestrial coordinate system used for GPS positioning may be a WGS-84 coordinate system. Therefore, a coordinate for absolute positioning is a WGS-84 coordinate.

(2) Perform relative positioning. That is, in a conventional terrestrial coordinate system, at least two receivers are used for detecting a relative position between a position of the user and a ground reference point (a known point). That is, a coordinate increment from the ground reference point to the position of the user is determined. There is a correlation between an ephemeris error and an atmospheric refractive error, and these errors may be eliminated by calculating a difference of observed quantities. Therefore, precision of relative positioning is higher than precision of absolute positioning.

2. A GPS positioning method may include the following according to different motion statuses of a user receiver during operating:

(1) Perform static positioning. That is, in a GPS positioning process, the receiver is disposed on a measurement station and is fixed. Strictly, such a static state is only relative, and generally means that a position of the receiver does not change relative to a surrounding point of the receiver.

(2) Perform dynamic positioning. That is, in a GPS positioning process, the receiver is in a moving state.

There are two manners for both absolute positioning and relative positioning: static positioning and dynamic positioning. That is, there are dynamic absolute positioning, static absolute positioning, dynamic relative positioning, and static relative positioning.

According to different ranging principles, a GPS positioning method may include measure-code pseudorange positioning, measure-phase pseudorange positioning, differential positioning, and the like, which are not listed one by one herein. In addition to GPS positioning, another method such as cell positioning may be used to obtain the position information.

For the obtaining the motion status of the user by using a motion sensor, the motion sensor may be a three-axis motion sensor or a nine-axis motion sensor. The three-axis motion sensor includes an acceleration sensor, a geomagnetic sensor, and a gyroscope. The nine-axis motion sensor means that the motion sensor includes a three-axis acceleration sensor, a three-axis magnetic sensor or geomagnetic sensor, and a three-axis gyroscope, where three axes are three coordinate axes. The motion sensor may detect the motion status of the user, such as fast walking, slow walking, running, and stillness. For an implementation principle of the motion sensor, refer to a smart band, such as Jawbone and Misfit.

In addition, the intensity of the external environmental noise may also be collected and detected by an earphone. That is, the method may be completed by two earphones and the terminal together.

S102. Determine a time window according to the position information and/or the motion status.

The determining a time window according to the position information may be: determining, based on the position information, a type of an environment in which the user is located; and determining the time window according to a preset correspondence between an environment type and a time window. The environment type may include a quiet environment, a noisy environment, and an unidentifiable environment. There is little noise or quite low noise in the quiet environment such as a home, a library, an office, and a café. There is relatively much noise in the noisy environment such as a shopping mall, a restaurant, a stadium, and a park; and the unidentifiable environment is an environment that is difficult to be identified, such as a roadside and a street. The type of the environment in which the user is located may be identified based on the position information such as a name of a place in which the user is located. For example, a residence community A may be identified as a quiet environment. Different time windows may be determined for different environment types. For example, a time window in the quiet environment is set to 10 s; a time window in the noisy environment is set to 5 s; and a time window in the unidentifiable environment is set to 0 s. The time windows corresponding to the different environment types may be set by default when the terminal is delivered from a factory, or defined by the user.

The determining a time window according to the motion status may be: determining stay duration of the user in a position according to the motion status. The stay duration may be the time window.

Specifically, different motion statuses indicate different stay duration in which the user stays in a position indicated by same position information. For example, when the user passes a road, a time spent in walking past the road is different from a time spent in running through the road. That is, when the position indicated by the same position information is passed by, times spent in different motion statuses are different. Therefore, the time window is related to the motion status.

The motion status may be include a moving state in which a position changes quickly, such as running; a moving state in which a position changes slowly, such as walking; and a state in which a position does not change, such as keeping still, a badminton hall, and a tennis hall. Persons skilled in the art can understand that, for the motion status in which a position does not change, stay duration of the user in a place represented by the position information is relatively long. The stay duration is the time window.

The terminal pre-stores a time window corresponding to each motion status of the user. As listed in Table 1, a time window in Table 1 is merely an example for description, and is not limited in this embodiment of the present invention. A time window may be manually set by the user, or a time window may be dynamically generated.

TABLE 1

| Motion status | Time window |
| --- | --- |
| Running | 5 s |
| Fast walking | 7 s |
| Slow walking | 10 s |
| Keeping still | 15 s |

In addition, the terminal may also pre-store time windows corresponding to different position information of the user.

In addition, the time window may be determined according to both the position information and the motion status. For example, a type of an environment in which the user is located is determined based on the position information. In the quiet environment, a preset time window size corresponding to the quiet environment is used as a time window. In the noisy environment, stay duration (which may be understood as stay duration generated when there is a specific distance (for example, two meters)), determined according to the motion status, in a position is used as a time window. In the unidentifiable environment, a time window is 0 s, that is, a response is made to external noise in real time and output of the earphone volume is adjusted. That is, the environment type is distinguished according to the position information. In the quiet environment, a preset value is used as a time window, while in the noisy environment, stay duration is used as a time window. Certainly, the time window may be determined in another manner according to the position information and the motion status.

In the foregoing, according to diverse implementations, the user may use various manners to determine the time window. Therefore, user experience is improved.

S103. Adjust earphone volume according to an intensity of external environmental noise in the time window.

For example, when the intensity of the external environmental noise in the time window is always greater than the preset threshold, it is considered that receiving the audio signal by the user by using the earphone is interfered by the external environmental noise. Therefore, the terminal turns up the earphone volume according to a current intensity of the external environmental noise, that is, the terminal controls a receiver to output corresponding earphone volume.

Alternatively, in the time window, when the intensity of the external environmental noise is less than the preset threshold, it is considered that receiving the audio signal by the user by using the earphone is interfered by the external environmental noise only in a short time. In this way, the external environmental noise is ignored, and adjustment of the earphone volume is not performed. For example, the user is in the quiet environment (for example, a library, an office, or an exhibition hall). In this case, it is considered that noise generation is an accidental event. Therefore, in this scenario, the terminal may make no response to external environmental noise generated in a short time, and does not perform an operation of adjusting the earphone volume.

In this embodiment of the present invention, when it is detected that the intensity of the external environmental noise is greater than the preset threshold, the position information and/or the motion status of the user is obtained; the time window is determined according to the position information and/or the motion status of the user; and the earphone volume is adjusted according to the intensity of the external environmental noise in the time window. Compared with the prior art, in this embodiment of the present invention, an inappropriate phenomenon such as turning up or turning down the earphone volume in a short time is avoided, and the earphone volume is appropriately adjusted by comprehensively considering the intensity of the external environmental noise and the position information and/or the motion status of the user. Therefore, user experience is improved.

Based on the foregoing, in an implementation, S103 may include: if an intensity of external environmental noise at a cut-off point of the time window is greater than the preset threshold, determining, according to a preset correspondence between a noise intensity and an earphone volume adjustment value, an earphone volume adjustment value corresponding to the intensity of the external environmental noise at the cut-off point of the time window; and adjusting the earphone volume by using the earphone volume adjustment value corresponding to the intensity of the external environmental noise at the cut-off point of the time window. The earphone volume adjustment value may include one of a weighting coefficient, an increased value, or a decreased value.

In another implementation, S103 may include: if an average intensity of the external environmental noise in the time window is greater than the preset threshold, determining, according to a preset correspondence between a noise intensity and an earphone volume adjustment value, an earphone volume adjustment value corresponding to the average intensity; and adjusting the earphone volume by using the earphone volume adjustment value corresponding to the average intensity. The earphone volume adjustment value may include one of a weighting coefficient, an increased value, or a decreased value.

According to the foregoing specific implementations and by pre-establishing the correspondence between a noise intensity and an earphone volume adjustment value, the following problem can be avoided: Blindly turning up earphone volume causes damage to hearing of the user when the intensity of the external environmental noise is relatively high. Therefore, the earphone volume is appropriately adjusted.

Based on the foregoing, the method may further include: after a preset earphone volume adjustment time, when it is detected that the intensity of the external environmental noise is less than the preset threshold, restoring the earphone volume to an unadjusted value. In this embodiment, after the preset earphone volume adjustment time, when the intensity of the external environmental noise is less than the preset threshold, the earphone volume can be restored to the unadjusted value. Therefore, user experience is further improved.

The correspondence between a noise intensity and an earphone volume adjustment value may also be obtained by means of machine leaning and training. For example, the terminal determines, according to earphone volume used by the user in a period of time and the intensity of the external environmental noise, a correspondence suitable for a usage habit of the user, and stores the correspondence. Alternatively, the user determines earphone volume when using the earphone for the first time, and the terminal determines, according to the earphone volume used by the user and the intensity of the external environmental noise, a correspondence suitable for a usage habit of the user, and stores the correspondence.

Based on this embodiment, physiological status information of the user may be further considered during adjustment of the earphone volume. That is, the earphone volume adjustment method may further include: detecting the physiological status information of the user; determining an earphone volume adjustment value corresponding to the physiological status information, where the earphone volume adjustment value may include one of a weighting coefficient, an increased value, or a decreased value; and adjusting the earphone volume by using the earphone volume adjustment value corresponding to the physiological status information. Superposition processing may be performed on the earphone volume adjustment value corresponding to the physiological status information and the earphone volume adjustment value corresponding to the average intensity of the external environmental noise in the time window or the earphone volume adjustment value corresponding to the intensity of the external environmental noise at the cut-off point of the time window.

The physiological status information may include one or any combination of an electrocardiogram (electrocardiogram, ECG for short) signal characteristic, a photoplethysmography (Photoplethysmography, PPG for short) signal characteristic, blood pressure, blood oxygen, an electromyographic signal, a facial expression, a heart rate, a body temperature, or pressure. The physiological status information may be obtained by a sensor. For example, the ECG signal characteristic and the PPG signal characteristic are obtained by using an electrocardiogram sensor, the electromyographic signal and the facial expression are obtained by using an electromyographic sensor, and the pressure is indirectly obtained by using the electrocardiogram sensor. For example, a correspondence between a heart rate and pressure is preset, and a high heart rate indicates that there is large pressure.

Specifically, if the earphone volume adjustment value is the weighting coefficient, a product of the weighting coefficient and current earphone volume is used as adjusted earphone volume. If the earphone volume adjustment value is the increased value, a sum of the increased value and current earphone volume is used as adjusted earphone volume. If the earphone volume adjustment value is the decreased value, a difference of current earphone volume and the decreased value is used as adjusted earphone volume.

In this embodiment, current physiological status information of the user is detected. Because different physiological status information has different earphone volume requirements and tolerance, when it is determined whether adjustment of the earphone volume is required, the current physiological status information of the user is also considered, and an earphone volume is adjusted according to the physiological status information of the user. Therefore, user experience is better. For example, when the user has relatively large pressure or is stressed, the earphone volume may be appropriately turned down; or when the user has no pressure or small pressure, the earphone volume may be appropriately turned up.

Still further, a type of a current service used by the user by using the earphone may further be considered during adjustment of the earphone volume. The type of the current service implemented by using the earphone means a specific service currently implemented by the user by using the earphone. In this embodiment, the earphone volume adjustment method may further include: detecting a service type of an audio signal in the earphone; and if the service type of the audio signal is an emergency service, decreasing a size of the time window to a preset time window value corresponding to the emergency service. The emergency service may include a call service, a preset reminder, and the like. That is, when the user implements the call service, it is considered that the call service belongs to the emergency service, and the size of the time window may be decreased based on the foregoing embodiment to implement earphone volume adjustment. In this embodiment, the size of the time window is adjusted for the emergency service, and the earphone volume is appropriately adjusted in a scenario of the emergency service. Therefore, user perception is improved.

Figure 3:
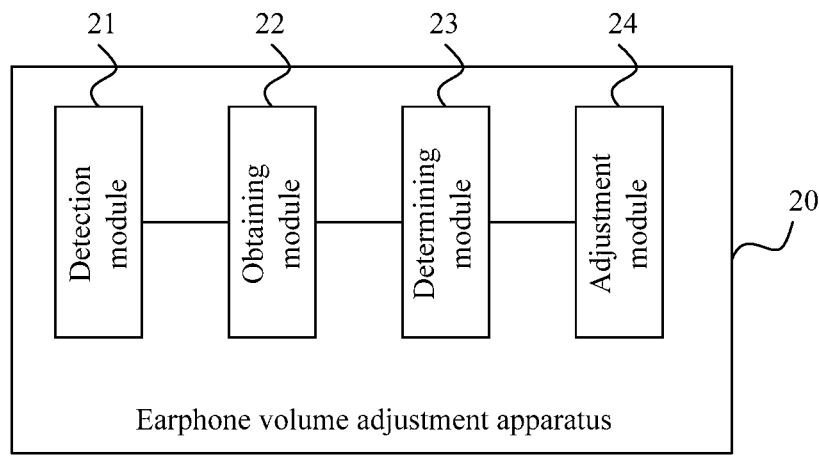
FIG. 3 is a schematic structural diagram of Embodiment 1 of an earphone volume adjustment apparatus according to the present invention.

FIG. 3 is a schematic structural diagram of Embodiment 1 of an earphone volume adjustment apparatus according to the present invention. Referring to FIG. 3, the earphone volume adjustment apparatus 20 includes a detection module 21, an obtaining module 22, a determining module 23, and an adjustment module 24.

The detection module 21 is configured to detect whether an intensity of external environmental noise is greater than a preset threshold. The obtaining module 22 is configured to: when the detection module 21 detects that the intensity of the external environmental noise is greater than the preset threshold, obtain position information and/or a motion status of a user. The determining module 23 is configured to determine a time window according to the position information and/or the motion status. The adjustment module 24 is configured to adjust earphone volume according to an intensity of external environmental noise in the time window.

The apparatus in this embodiment may be configured to execute the technical solution of the foregoing method embodiment, implementation principles and technical effects thereof are similar to those of the technical solution of the foregoing method embodiment, and details are not described herein again.

In this embodiment, the determining module 23 may be specifically configured to: determine, based on the position information, a type of an environment in which the user is located, where the environment type includes a quiet environment, a noisy environment, and an unidentifiable environment; and determine the time window according to a preset correspondence between an environment type and a time window.

Alternatively, the determining module 23 may be specifically configured to determine stay duration of the user in a position (a quite short distance (for example, two meters)) according to the motion status. The time window is the stay duration.

Alternatively, the determining module 23 may be specifically configured to: determine, based on the position information, a type of an environment in which the user is located; and determine the time window according to the environment type and the motion status.

In an implementation, the adjustment module 24 may be specifically configured to: if an intensity of external environmental noise at a cut-off point of the time window is greater than the preset threshold, determine, according to a preset correspondence between a noise intensity and an earphone volume adjustment value, an earphone volume adjustment value corresponding to the intensity of the external environmental noise at the cut-off point of the time window; and adjust the earphone volume by using the earphone volume adjustment value corresponding to the intensity of the external environmental noise at the cut-off point of the time window. The earphone volume adjustment value may include one of a weighting coefficient, an increased value, or a decreased value.

In another implementation, the adjustment module 24 may be specifically configured to: if an average intensity of the external environmental noise in the time window is greater than the preset threshold, determine, according to a preset correspondence between a noise intensity and an earphone volume adjustment value, an earphone volume adjustment value corresponding to the average intensity; and adjust the earphone volume by using the earphone volume adjustment value corresponding to the average intensity. The earphone volume adjustment value may include one of a weighting coefficient, an increased value, or a decreased value.

Optionally, the adjustment module 24 may be further configured to: after a preset earphone volume adjustment time, when the detection module detects that the intensity of the external environmental noise is less than the preset threshold, restore the earphone volume to an unadjusted value.

Further, the detection module 21 may be further configured to detect physiological status information of the user. The physiological status information includes one or any combination of an ECG signal characteristic, a PPG signal characteristic, blood pressure, blood oxygen, an electromyographic signal, a facial expression, a heart rate, a body temperature, or pressure. In this case, the determining module 23 may be further configured to determine an earphone volume adjustment value corresponding to the physiological status information. The earphone volume adjustment value includes one of a weighting coefficient, an increased value, or a decreased value. The adjustment module 24 may be further configured to adjust the earphone volume by using the earphone volume adjustment value corresponding to the physiological status information.

Still further, the detection module 21 may be further configured to detect a service type of an audio signal in an earphone. The determining module 23 may be further configured to: if the service type of the audio signal is an emergency service, decrease a size of the time window to a preset time window value corresponding to the emergency service. The emergency service includes a call service and a preset reminder.

In the several embodiments provided in the present application, it should be understood that the disclosed device and method may be implemented in other manners. For example, the described device embodiment is merely an example. For example, the unit or module division is merely logical function division and may be other division in actual implementation. For example, multiple units or modules may be combined or integrated into another system, or some features may be ignored or not performed. In addition, the displayed or discussed mutual couplings or direct couplings or communication connections may be implemented through some interfaces. The indirect couplings or communication connections between the devices or modules may be implemented in electronic, mechanical, or other forms.

The modules described as separate parts may or may not be physically separate, and parts displayed as modules may or may not be physical modules, may be located in one position, or may be distributed on a plurality of network units. Some or all the modules may be selected according to actual needs to achieve the objectives of the solutions of the embodiments.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are merely intended for describing the technical solutions of the present invention rather than limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. An earphone volume adjustment method, comprising:
when it is detected that an intensity of external environmental noise is greater than a preset threshold, obtaining position information of a user;
determining a time window according to the position information, which is specifically: determining, based on the position information, a type of an environment in which the user is located, wherein the environment type comprises a quiet environment, a noisy environment, and an unidentifiable environment; and determining the time window according to a preset correspondence between an environment type and a time window;
adjusting earphone volume according to an intensity of external environmental noise in the time window,
detecting physiological status information of the user, wherein the physiological status information comprises one or any combination of an electrocardiogram (ECG) signal characteristic, a photoplethysmography (PPG) signal characteristic, blood pressure, blood oxygen, an electromyographic signal, a facial expression, a heart rate, a body temperature, or pressure;

determining an earphone volume adjustment value corresponding to the physiological status information, wherein the earphone volume adjustment value comprises one of a weighting coefficient, an increased value, or a decreased value; and adjusting the earphone volume by using the earphone volume adjustment value corresponding to the physiological status information.

2. The method according to claim 1, further comprising:
obtaining a motion status of the user; and
determining the time window according to the motion status, which is specifically: determining stay duration of the user in a position according to the motion status.

3. The method according to claim 1, wherein the adjusting earphone volume according to an intensity of external environmental noise in the time window comprises:

if an intensity of external environmental noise at a cut-off point of the time window is greater than the preset threshold, determining, according to a preset correspondence between a noise intensity and an earphone volume adjustment value, an earphone volume adjustment value corresponding to the intensity of the external environmental noise at the cut-off point of the time window; and adjusting the earphone volume by using the earphone volume adjustment value corresponding to the intensity of the external environmental noise at the cut-off point of the time window, wherein the earphone volume adjustment value comprises one of a weighting coefficient, an increased value, or a decreased value.

4. The method according to claim 1, wherein the adjusting earphone volume according to an intensity of external environmental noise in the time window comprises:

if an average intensity of the external environmental noise in the time window is greater than the preset threshold, determining, according to a preset correspondence between a noise intensity and an earphone volume adjustment value, an earphone volume adjustment value corresponding to the average intensity; and adjusting the earphone volume by using the earphone volume adjustment value corresponding to the average intensity, wherein the earphone volume adjustment value comprises one of a weighting coefficient, an increased value, or a decreased value.

5. The method according to claim 1, wherein the method further comprises:

after a preset earphone volume adjustment time, when it is detected that the intensity of the external environmental noise is less than the preset threshold, restoring the earphone volume to an unadjusted value.

6. The method according to claim 1, wherein the method further comprises:

detecting a service type of an audio signal in an earphone; and if the service type of the audio signal is an emergency service, decreasing a size of the time window to a preset time window value corresponding to the emergency service, wherein the emergency service comprises a call service and a preset reminder.

7. A terminal, wherein the terminal comprises a processor, a memory, and a microphone, and the microphone is configured to: collect a noise signal in an external environment, and convert the noise signal into an electrical signal;

the memory stores a program or an instruction, and the processor is configured to execute the following method by invoking the program or the instruction stored in the memory:

when detecting that an intensity of external environmental noise is greater than a preset threshold, obtaining position information of a user;

determining a time window according to the position information, which is specifically:

determining, based on the position information, a type of an environment in which the user is located, wherein the environment type comprises a quiet environment, a noisy environment, and an unidentifiable environment; and determining the time window according to a preset correspondence between an environment type and a time window; and adjusting earphone volume according to an intensity of external environmental noise in the time window, the processor is further configured to execute the following steps:

detecting physiological status information of the user, wherein the physiological status information comprises one or any combination of an electrocardiogram (ECG) signal characteristic, a photoplethysmography (PPG) signal characteristic, blood pressure, blood oxygen, an electromyographic signal, a facial expression, a heart rate, a body temperature, or pressure;

determining an earphone volume adjustment value corresponding to the physiological status information, wherein the earphone volume adjustment value comprises one of a weighting coefficient, an increased value, or a decreased value; and adjusting the earphone volume by using the earphone volume adjustment value corresponding to the physiological status information.

8. The terminal according to claim 7, further comprising a motion sensor configured to sense a motion status of a user, wherein the processor is configured to execute the following method:

determining the time window according to the motion status, which is specifically: determining stay duration of the user in a position according to the motion status.

9. The terminal according to claim 7, wherein the adjusting earphone volume according to an intensity of external environmental noise in the time window comprises:

if an intensity of external environmental noise at a cut-off point of the time window is greater than the preset threshold, determining, according to a preset correspondence between a noise intensity and an earphone volume adjustment value, an earphone volume adjustment value corresponding to the intensity of the external environmental noise at the cut-off point of the time window; and adjusting the earphone volume by using the earphone volume adjustment value corresponding to the intensity of the external environmental noise at the cut-off point of the time window, wherein the earphone volume adjustment value comprises one of a weighting coefficient, an increased value, or a decreased value.

10. The terminal according to claim 7, wherein the adjusting earphone volume according to an intensity of external environmental noise in the time window comprises:

if an average intensity of the external environmental noise in the time window is greater than the preset threshold, determining, according to a preset correspondence between a noise intensity and an earphone volume adjustment value, an earphone volume adjustment value corresponding to the average intensity; and adjusting the earphone volume by using the earphone volume adjustment value corresponding to the average intensity, wherein the earphone volume adjustment value comprises one of a weighting coefficient, an increased value, or a decreased value.

11. The terminal according to claim 7, wherein the processor is further configured to execute the following steps:
after a preset earphone volume adjustment time, when it is detected that the intensity of the external environmental noise is less than the preset threshold, restoring the earphone volume to an unadjusted value.

12. The terminal according to claim 7, wherein the processor is further configured to execute the following steps:
detecting a service type of an audio signal in an earphone; and
if the service type of the audio signal is an emergency service, decreasing a size of the time window to a preset time window value corresponding to the emergency service, wherein the emergency service comprises a call service and a preset reminder.

* * * * *